United States Patent
Im et al.

(10) Patent No.: US 7,505,297 B2
(45) Date of Patent: Mar. 17, 2009

(54) SEMICONDUCTOR MEMORY DEVICE

(75) Inventors: Jae-Hyuk Im, Kyoungki-do (KR); Chang-Ho Do, Kyoungki-do (KR)

(73) Assignee: Hynix Semiconductor, Inc. (KR)

( * ) Notice: Subject to any disclaimer, the term of this patent is extended or adjusted under 35 U.S.C. 154(b) by 111 days.

(21) Appl. No.: 11/480,197

(22) Filed: Jun. 29, 2006

(65) Prior Publication Data

US 2007/0070674 A1    Mar. 29, 2007

(30) Foreign Application Priority Data

Sep. 29, 2005    (KR) .............. 10-2005-0090879
May 2, 2006    (KR) .............. 10-2006-0039707

(51) Int. Cl.
*G11C 5/06* (2006.01)
(52) U.S. Cl. .............. 365/63; 365/189.11; 365/205; 365/207
(58) Field of Classification Search .............. 365/63, 365/189.11, 205, 207
See application file for complete search history.

(56) References Cited

U.S. PATENT DOCUMENTS

| | | | |
|---|---|---|---|
| 5,859,807 A | 1/1999 | Otori et al. | |
| 6,392,944 B1 | 5/2002 | Kono | |
| 6,535,415 B2 * | 3/2003 | Takemura et al. | 365/63 |
| 6,717,880 B2 * | 4/2004 | Jeong | 365/227 |
| 6,853,593 B1 * | 2/2005 | Bae | 365/189.09 |

FOREIGN PATENT DOCUMENTS

| | | |
|---|---|---|
| JP | 2000-243085 | 9/2000 |
| KR | 1020000051065 | 8/2000 |
| KR | 1020010037530 | 5/2001 |

* cited by examiner

*Primary Examiner*—Son Dinh
*Assistant Examiner*—Toan Le
(74) *Attorney, Agent, or Firm*—Blakely, Sokoloff, Taylor & Zafman

(57) ABSTRACT

Provided are semiconductor design technologies, especially a bit line sense amplifier array of a semiconductor memory device. The semiconductor memory device includes a plurality of unit bit line sense amplifiers, a pull-up power line which is a power line of the plurality of unit bit line sense amplifiers, a single normal driver prepared on one side of the pull-up power line, and a plurality of over drivers arranged at regular intervals and partially connected to the pull-up power line.

6 Claims, 7 Drawing Sheets

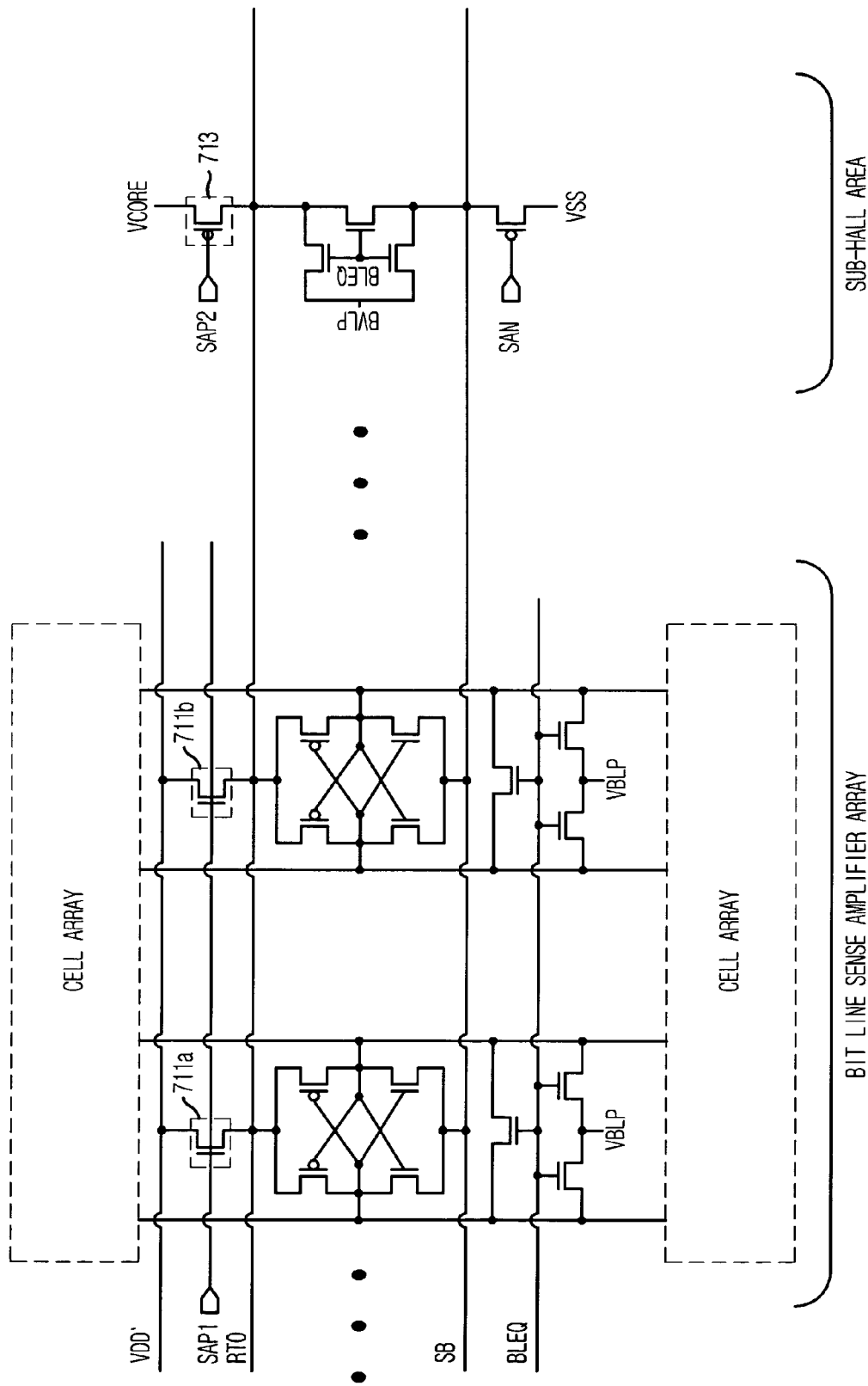

SEMICONDUCTOR MEMORY DEVICE

FIELD OF THE INVENTION

The present invention relates to semiconductor design technologies; and, more particularly, to a bit line sense amplifier array of a semiconductor memory device.

DESCRIPTION OF RELATED ART

In a semiconductor memory device, it is a current trend that a voltage reduction of a power supply voltage is accelerating due to progressing of continuous scaling down of line width and cell size. According to this, a need has existed for design technology to meet the performance required in the low voltage environment.

Most semiconductor memory devices incorporate in a chip an internal voltage generating circuit that accepts an external voltage (power supply voltage) and generates an internal voltage. As a result, those devices themselves allow supply of voltages required for operating of circuits inside the chip. Among them, in a memory device using a bit line sense amplifier such as Dynamic Random Access Memory (DRAM), a core voltage VCORE is used to sense cell data.

But, in case where only the core voltage is utilized in the DRAM that is under the trend that an operating voltage becomes lower, there may be difficulty in amplifying much cell data for a shorter time.

To solve such a problem, there is adopted a bit line sense amplifier over driving method of driving a pull-up power line of a bit line sense amplifier for a preset time with a higher voltage (generally, power supply voltage VDD) than a core voltage VCORE at an initial operation of the bit line sense amplifier, that is, after charge sharing between a memory cell and a bit line.

Hereinafter, a semiconductor memory device adopting such an over driving method will be introduced.

FIG. 1 shows a plan view of a conventional semiconductor memory device.

Referring to FIG. 1, the semiconductor memory device is divided into a cell area and a sub-hall area among many areas. The cell area is typically a cell array including a Word Line (WL) and a Bit Line (BL). And, the sub-hall area is typically a bit line sense amplifier driver for driving a bit line sense amplifier array having a Sub WL Driver (SWD) for driving the WL and a plurality of unit bit line sense amplifiers for sensing and amplifying data carried on the BL, and pull-up and pull-down power lines of the bit line sense amplifiers.

Details of the bit line sense amplifier array will be given below.

FIG. 2 is a circuit diagram of the bit line sense amplifier array depicted in FIG. 1.

Referring to FIG. 2, the bit line sense amplifier array is composed of a plurality of unit bit line sense amplifiers 201 and 203. There is prepared the plurality of unit bit line sense amplifiers, but it will be treated as singular below for convenience of explanation. Additional devices are bit line precharge portions 205 and 207 that are configured to correspond to the unit bit line sense amplifiers 201 and 203 and precharge the bit line.

To control the bit line sense amplifier array, there are prepared in the sub-hall area a normal driver 213, an over driver 211 and a pull-down driver 215 for driving power lines RTO and SB of the unit bit line sense amplifiers 201 and 203 by using the core voltage VCORE (normal driving voltage), the power supply voltage VDD (over driving voltage) and a ground voltage VSS. Here, reference numeral 209 denotes a power line precharge portion for precharging the power lines RTO and SB of the unit bit line sense amplifiers 201 and 203.

At this time, the normal driver 213 is driven by a normal driving signal SAP2, the over driver 211 is driven by an over driving signal SAP1, and the pull-down driver 215 is driven by a pull-down driving signal SAN.

Here, the unit bit line sense amplifiers 201 and 203 perform sensing operations by using the pull-up power line RTO in common. Namely, those amplifiers conduct the over driving operation during an initial certain interval of a sensing operation interval and thereafter the normal driving operation, thereby improving sensing efficiency.

In this process, however, the device for controlling the over driving operation is provided in the sub-hall area and shares its output (the normal driving voltage or over driving voltage). Therefore, the unit bit line sense amplifiers, which is relatively far from the sub-hall area having the over driver 211 and the normal driver 213, perform the over driving operation with a voltage decreased by loading of the power line of the unit bit line sense amplifiers. Thus, there may be errors of sensing speed and sensing efficiency.

In addition, since the common node that is named as the pull-up power line RTO is a sharing node of the plurality of unit bit line sense amplifiers 201 and 203, it has a problem that is weak in a voltage drop by power consumption owing to weakness in a mesh shape, when connecting the pull-up power line RTO with and the power supply voltage VDD through the over driver 211 that generally uses a PMOS transistor for low power.

SUMMARY OF THE INVENTION

It is, therefore, an object of the present invention to provide a semiconductor memory device capable of solving a problem of an operating efficiency difference caused by loading difference of supply line conveying a driving voltage of bit line sense amplifiers.

Another object of the present invention is to provide a semiconductor memory device in which a plurality of bit line sense amplifiers has a same over driving operation efficiency.

Still another object of the present invention is to offer a semiconductor memory device capable of solving a voltage drop problem due to a pull-up power line weak in a mesh shape.

In accordance with an aspect of the present invention, there is provided a semiconductor memory device including: a plurality of unit bit line sense amplifiers; a pull-up power line which is a power line of the plurality of unit bit line sense amplifiers; a single normal driver prepared on one side of the pull-up power line; and a plurality of over drivers arranged at regular intervals and partially connected to the pull-up power line.

The other objectives and advantages of the invention will be understood by the following description and will also be appreciated by the embodiments of the invention more clearly. Further, the objectives and advantages of the invention will readily be seen that they can be realized by the means and its combination specified in the claims.

BRIEF DESCRIPTION OF THE DRAWINGS

The above and other objects and features of the present invention will become apparent from the following description of preferred embodiments taken in conjunction with the accompanying drawings, in which:

FIG. 5c is a circuit diagram showing an example that the over drivers that are embodied with the PMOS transistors in FIG. 4 are implemented with NMOS transistors.

DETAILED DESCRIPTION OF THE INVENTION

Hereinafter, a preferred embodiment of the present invention will be set forth in detail with reference to the accompanying drawings so that the invention can be readily carried out by those in the art to which the invention pertains.

Figure 1:
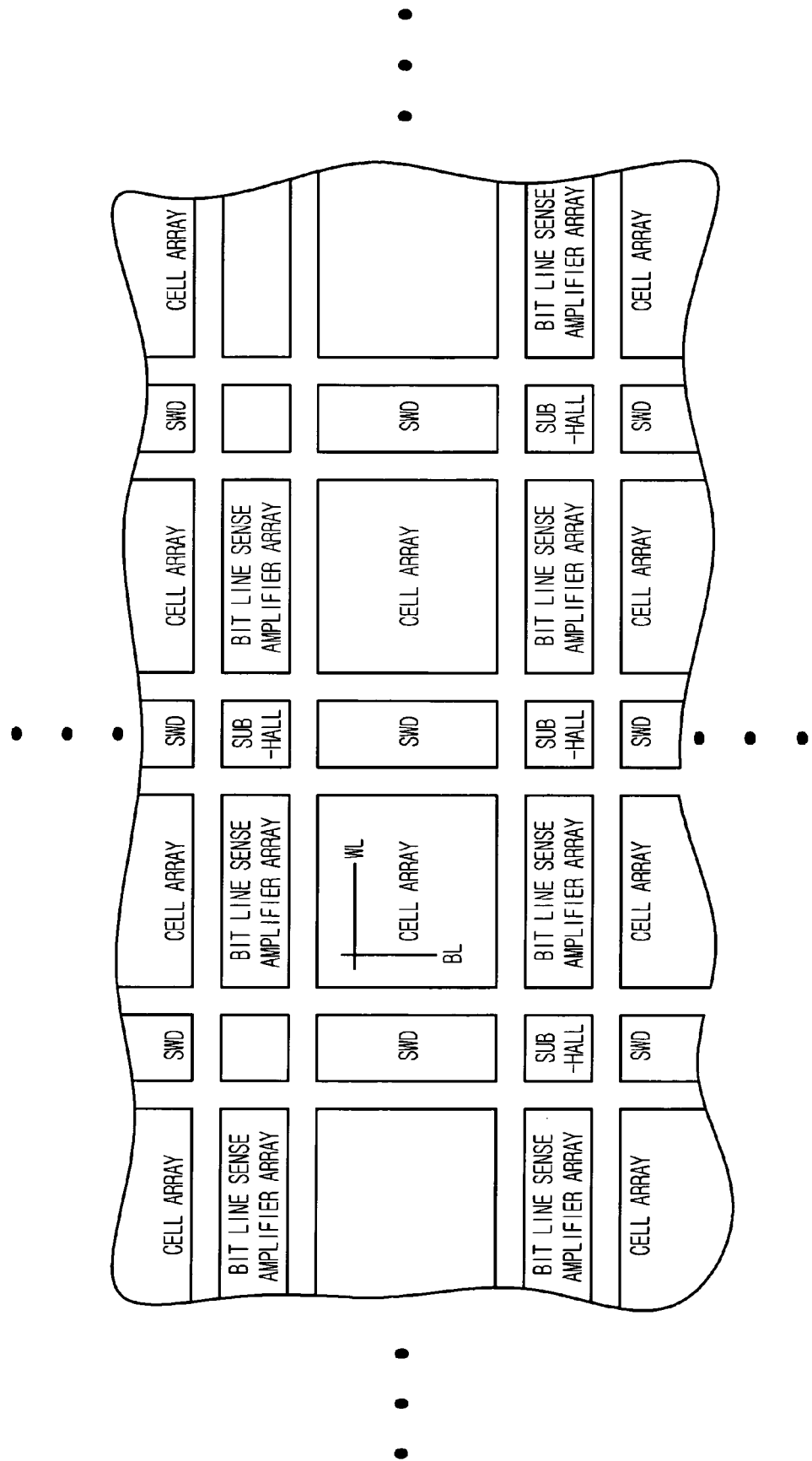
FIG. 1 shows a plan view of a conventional semiconductor memory device.
Figure 2:
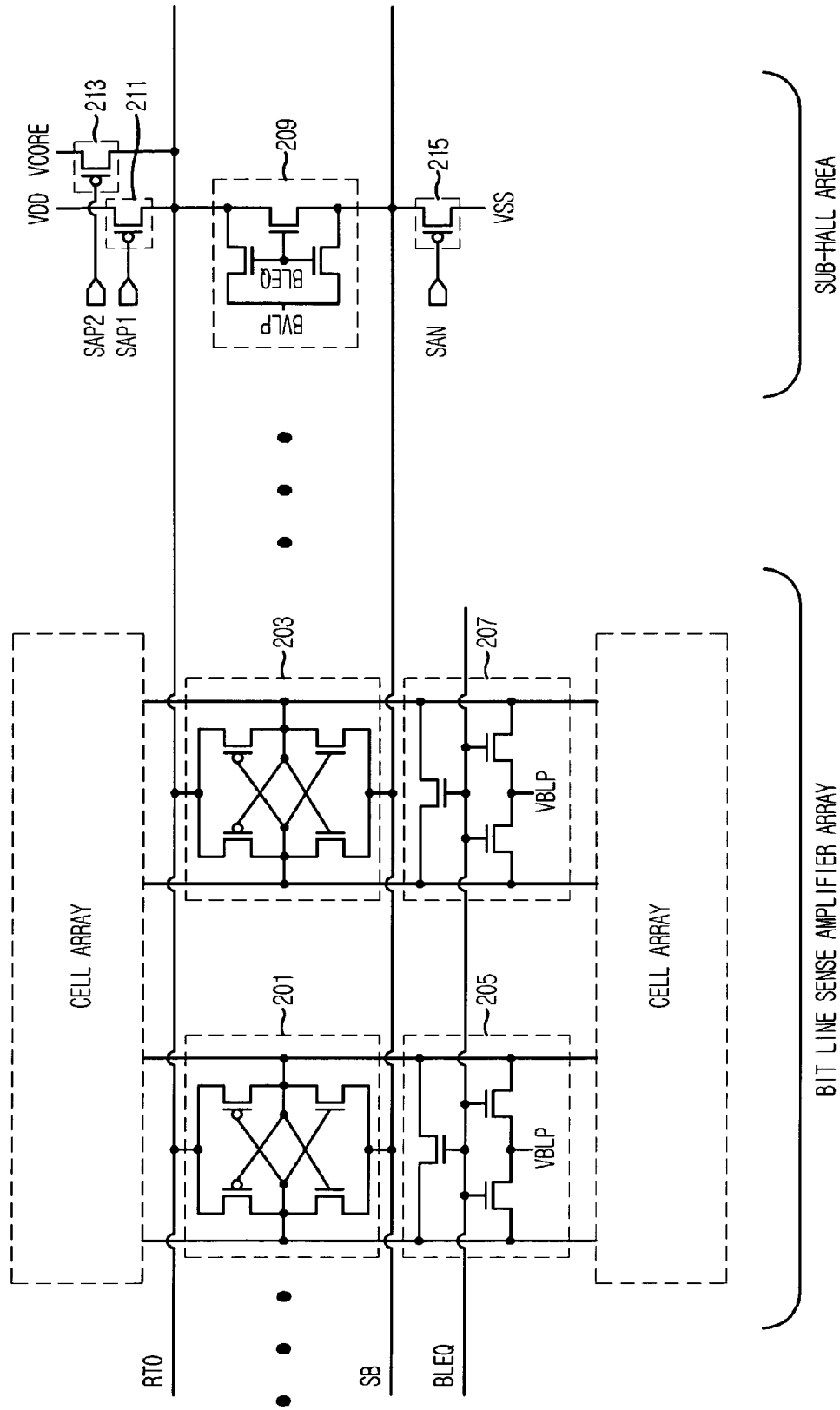
FIG. 2 is a circuit diagram of the bit line sense amplifier array depicted in FIG. 1.
Figure 3:
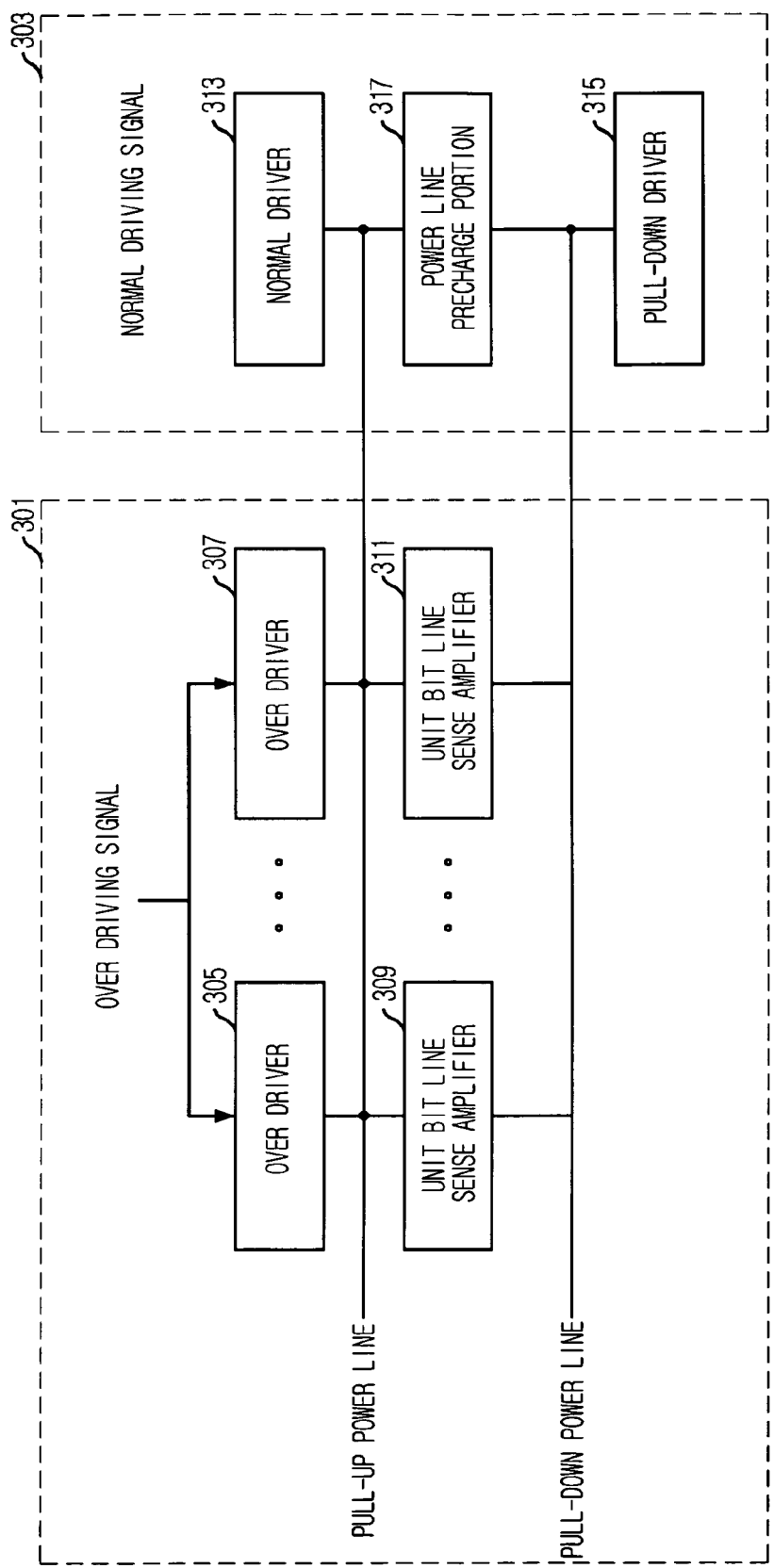
FIG. 3 is a view showing a concept of a bit line sense amplifier array in accordance with an embodiment of the present invention.

FIG. 3 is a view illustrating a concept of a bit line sense amplifier array in accordance with an embodiment of the present invention.

As shown in FIG. 3, the bit line sense amplifier array 301 includes a plurality of unit bit line sense amplifiers 309 and 311, and a plurality of over drivers 305 and 307, which is configured to correspond to the positions and the number of the plurality of unit bit line sense amplifiers 309 and 311. The number of the unit bit line sense amplifiers is determined within a range that its operation efficiency is not decreased by loading difference of the power lines of the bit line sense amplifiers connected in parallel.

In addition, within a sub-hall area 303 for controlling the bit line sense amplifier array 301, there are provided a normal driver 313 and a pull-down driver 315 for driving a pull-up power line and a pull-down power line that are common power lines of the bit line sense amplifier array 301.

The concept of the present invention can be grasped from FIG. 3. In other words, the operating efficiencies of the plurality of unit bit line sense amplifiers 311 and 309 are the same by the plurality of over drivers 305 and 307, which is provided partially between the first unit bit line sense amplifier 311 and the last unit bit line sense amplifier 309 or prepared to correspond to the unit bit line sense amplifiers 311 and 309.

A detailed description of the above concept will be given below.

Figure 4:
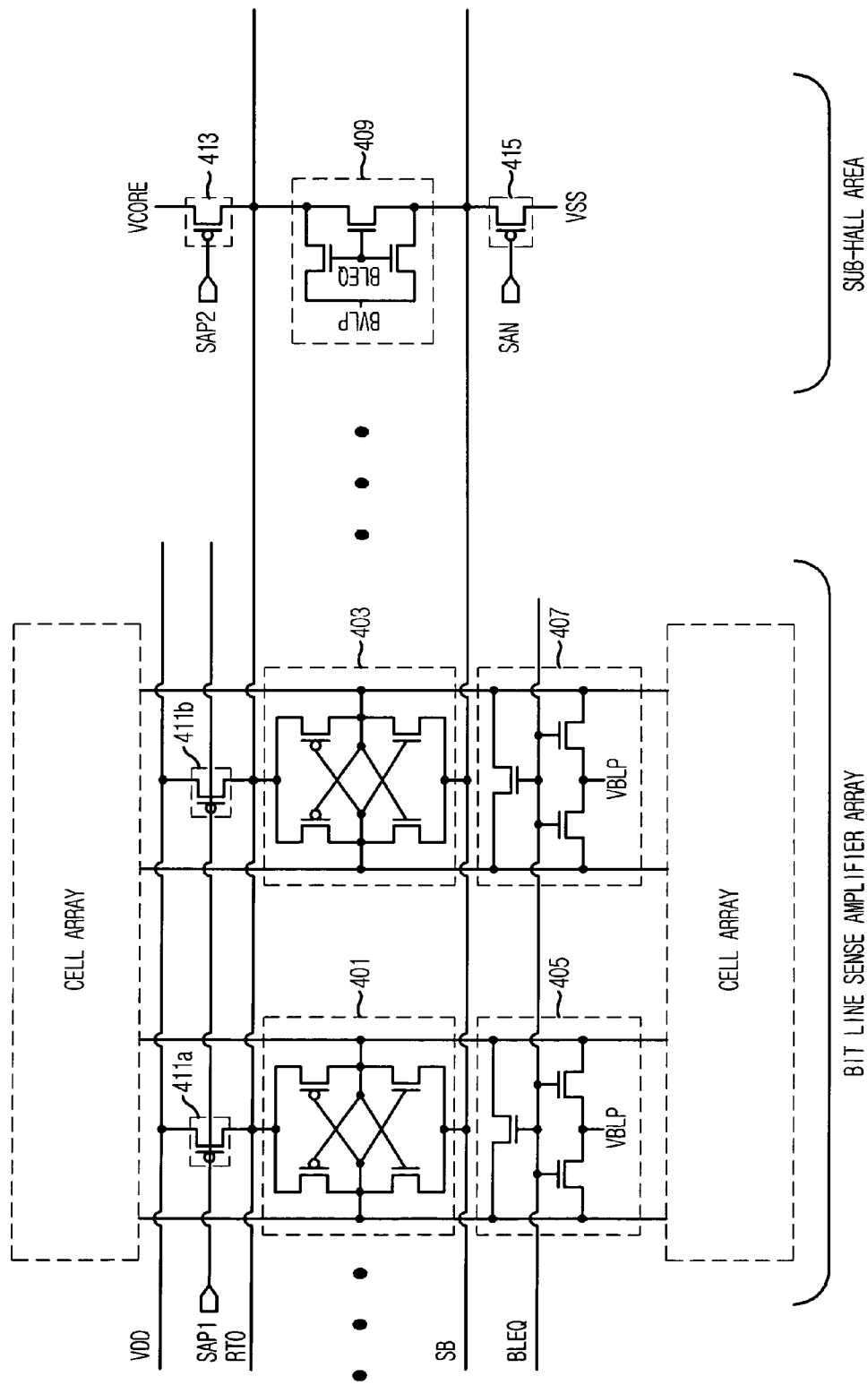
FIG. 4 is a circuit diagram illustrating the bit line sense amplifier array of FIG. 3.

FIG. 4 is a circuit diagram showing the bit line sense amplifier array of FIG. 3.

Referring to FIG. 4, the bit line sense amplifier array is composed of a plurality of unit bit line sense amplifiers 401 and 403, and a plurality of over drivers 411a and 411b, which is provided to correspond to the positions and the number of the unit bit line sense amplifiers 401 and 403. There is prepared the plurality of unit bit line sense amplifiers, but it will be treated as singular below for convenience of explanation. As additional devices, there are provided bit line precharge portions 405 and 407 that are configured to correspond to the unit bit line sense amplifiers 401 and 403 and precharge the BL. At this time, the over drivers 411a and 411b are configured to correspond to the positions and the number of the unit bit line sense amplifiers 401 and 403, but may be partially prepared on common power lines of the unit bit line sense amplifiers 401 and 403 within a range that no over driving efficiency difference of the unit bit line sense amplifiers 401 and 403 is issued.

To control the bit line sense amplifier array, there are prepared in the sub-hall area a normal driver 413 and a pull-down driver 415 for driving power lines RTO and SB of the unit bit line sense amplifiers 401 and 403 by using a core voltage VCORE or normal driving voltage and a ground voltage VSS. Reference numeral 409 denotes a power line precharge portion 409 for precharging the power lines RTO and SB of the unit bit line sense amplifiers 401 and 403.

At this time, the normal driver 413 is driven by a normal driving signal SAP2, the over drivers 411a and 411b are driven by an over driving signal SAP1, and the pull-down driver 415 is driven by a pull-down driving signal SAN.

Specifically, the unit bit line sense amplifiers 401 and 403 perform sensing operations by utilizing the pull-up power line RTO in common. That is, they conduct the over driving operation during an initial certain interval of a sensing operation interval and thereafter the normal driving operation, thus improving sensing efficiency.

The over drivers 411a and 411b, the normal driver 413 and the pull-down driver 415 can be implemented with PMOS transistors.

Structurally, the prior art is provided with the single over driver on one side of the unit bit line sense amplifiers 401 and 403. Unlike the prior art, the present invention is partially provided with the over drivers to correspond to the positions and the number of the unit bit line sense amplifiers 401 and 403 or within a range that no over driving efficiency difference of the unit bit line sense amplifiers 401 and 403 occurs.

In succession, an operation of the bit line sense amplifier array will be described hereinafter.

The bit line and the memory cell share an electric charge wherein data is carried on the bit line. And, in order to amplify this, the unit bit line sense amplifiers 401 and 403 are driven. At this time, in the amplification operation of the unit bit line sense amplifiers 401 and 403, the over driving signal SAP1 is activated for the over driving operation during an initial operation interval, thus driving the over drivers 411a and 411b; and the normal driving signal SAP2 is activated for the normal driving operation during a next interval, thus driving the normal driver 413 to perform the amplification operation.

As a result, it is structured in such a way that an over driving efficiency difference between the unit bit line sense amplifiers 401 and 403 is not occurred by the over drivers 411a and 411b, which are partially prepared to correspond to the positions and the number of the unit bit line sense amplifiers 401 and 403 or within a range that the over driving efficient difference thereof does not take place.

In case where any problem individually occurs in the over drivers 411a and 411b and thus no operation is done therein, a malfunctioning of the unit bit line sense amplifiers 401 and 403 can be prevented because the over drivers are prepared in plural.

In addition, by allowing the pull-up power line RTO to have the plurality of power sources, power supply voltage VDD, by the plurality of over drivers 411a and 411b, the present invention solves the prior art problem that introduces a voltage drop due to the pull-up power line, which is weak in the mesh shape, driven by the single power source, i.e., the power supply voltage VDD.

The logic types and arrangements employed in the above-described embodiments are exemplified with respect to the input and output signals being high activation signals; and therefore, when their activation polarities are changed, the logic implementation should also be changed accordingly.

The present invention can be embodied in various ways and modifications of the embodiments can also be technically and easily deduced by those skilled in the art. Thus, a detailed description of each case is omitted here.

In addition, it is also only exemplified but not restrictive that the over drivers and the normal driver are implemented with a plurality of logic circuits.

Figure 5A:
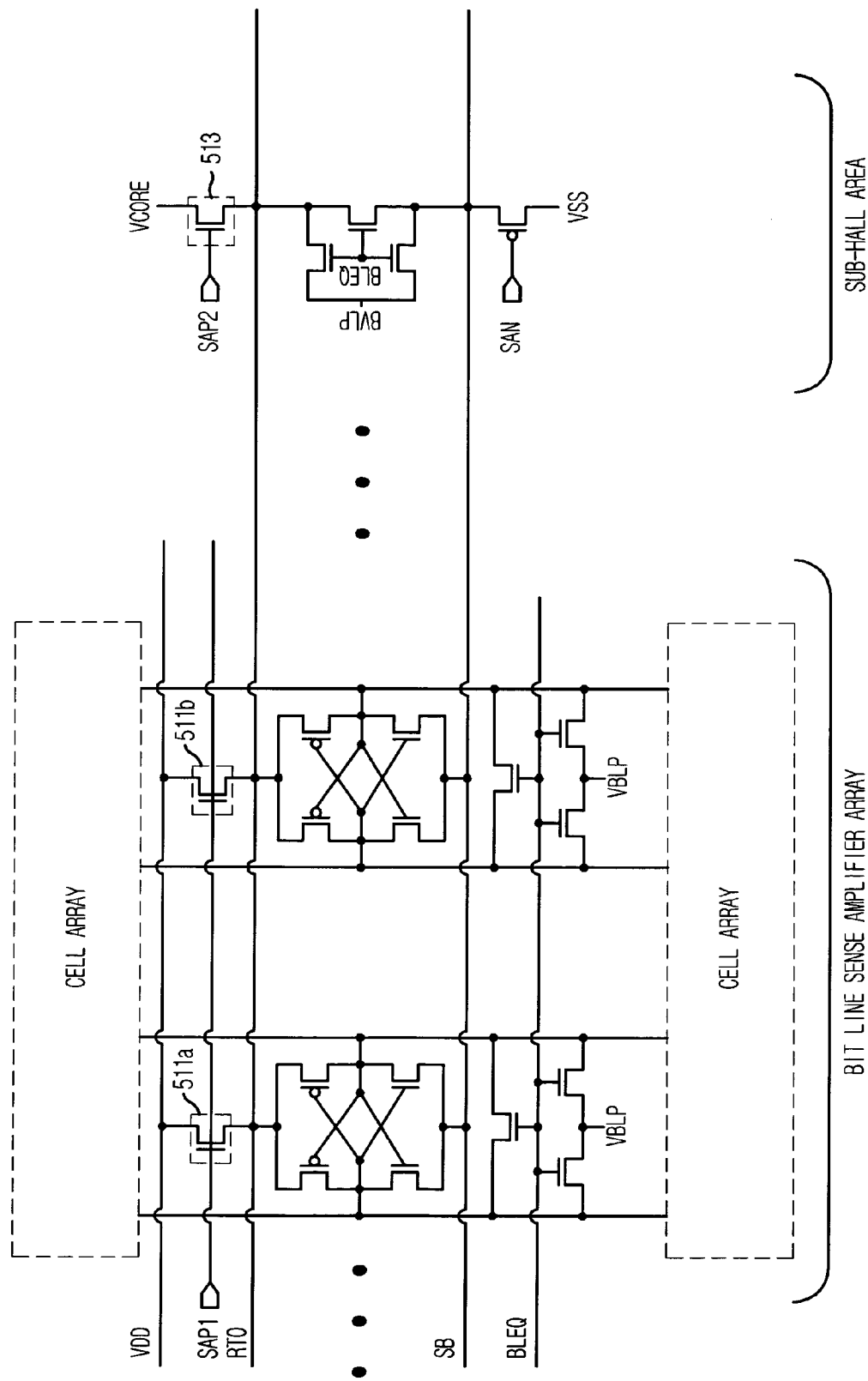
FIG. 5a is a circuit diagram showing an example that the over drivers and the normal driver that are embodied with the PMOS transistors in FIG. 4 are implemented with NMOS transistors.

Explaining this referring to the drawings, FIG. 5a is a circuit diagram showing an example that the over drivers 411a and 411b and the normal driver 413 that are embodied with the PMOS transistors in FIG. 4 are implemented with NMOS transistors.

If the over drivers 511a and 511b and the normal driver 413 are implemented with the NMOS transistors as above, it needs to turn them on with a higher voltage by at least threshold voltage than the power supply voltage VDD.

As mentioned above, if the NMOS transistors are applied, the power consumption is increased. But, generally, the PMOS transistors have electrons of minority carriers, and therefore, have a small number of electrons per unit area compared to the NMOS transistors. Thus, the NMOS transistors are implemented by a smaller area than PMOS transistors under the assumption that they acquire a same driving current, thereby decreasing a size of the semiconductor memory device.

Figure 5B:
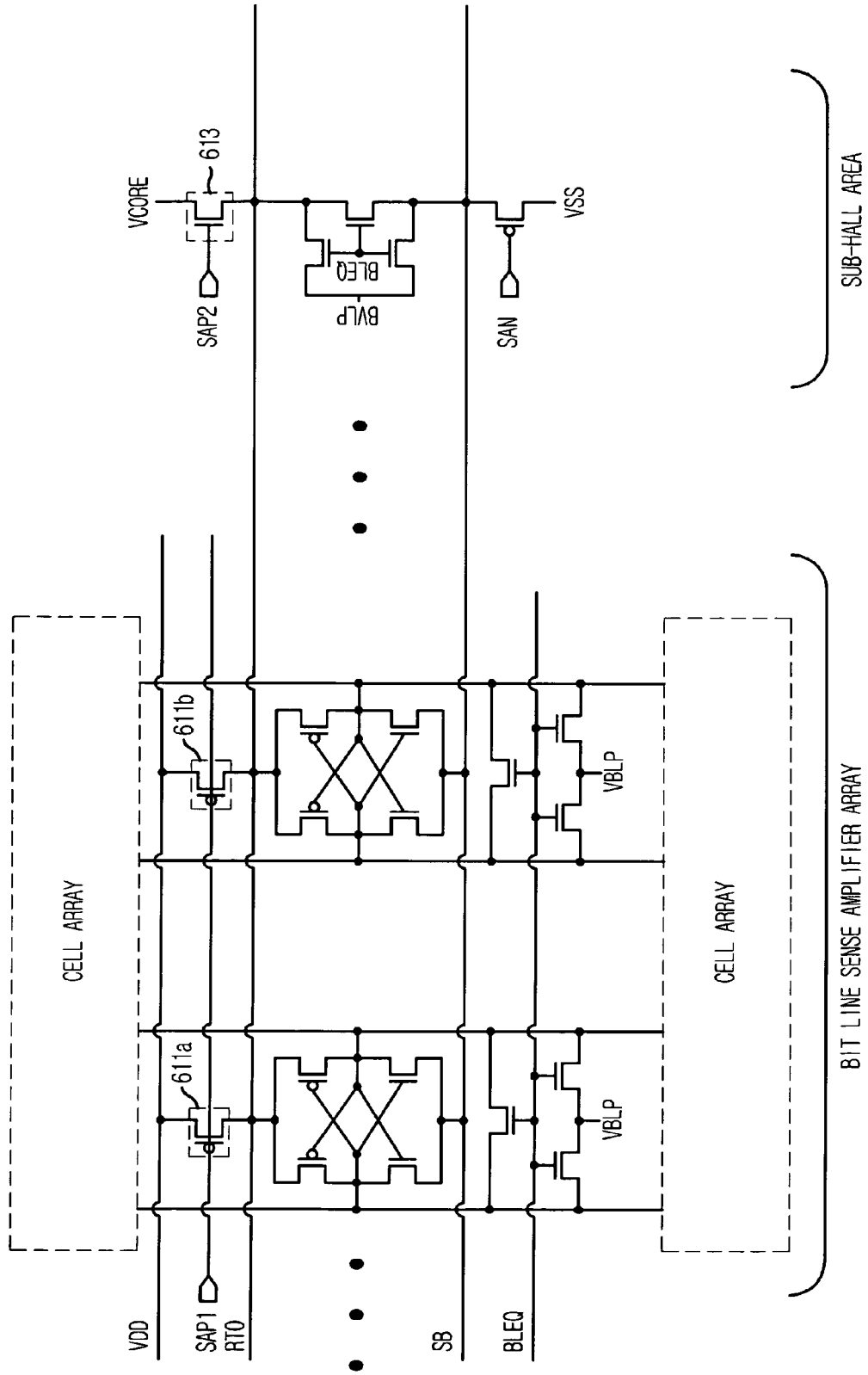
FIG. 5b is a circuit diagram showing an example that the normal driver that is embodied with the PMOS transistor in FIG. 4 is implemented with NMOS transistor.

FIG. 5b is a circuit diagram showing an example that the normal driver 413 that is embodied with the PMOS transistor in FIG. 4 is implemented with NMOS transistor.

The present invention decreases the power consumption by implementing over drivers 611a and 611b, which have relatively high loading compared to the normal driver 613, with PMOS transistors, and also reduces a sub-hall area by implementing the normal driver 613 with NMOS transistor.

FIG. 5c is a circuit diagram showing an example that the over drivers 711a and 711b that are embodied with the PMOS transistors in FIG. 4 are implemented with NMOS transistors.

This is to decrease an area of the bit line sense amplifier array and also decrease the power consumption through the normal driver 713 implemented with the PMOS transistor.

As described above, the present invention can enable a stable over driving operation of the unit bit line sense amplifiers and also improve a speed of a semiconductor memory device because no over driving efficiency difference is issued between the unit bit line sense amplifiers.

Furthermore, when any problem individually occurs in the over drivers and thus no operation is done therein, the present invention can prevent a malfunctioning of the unit bit line sense amplifiers because the over drivers are prepared in plural.

Moreover, the present invention can save power by solving a voltage drop problem due to the pull-up power line weak in the mesh shape.

Finally, the present invention can decrease an area and power consumption of the semiconductor memory device by implementing the over drivers and the normal driver with PMOS or NMOS transistors.

The present application contains subject matter related to Korean patent application No. 2005-90879 & 2006-39707, filed in the Korean Patent Office on Sep. 29, 2005 & May 2, 2006, the entire contents of which are incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device comprising:
   a plurality of unit bit line sense amplifiers;
   a pull-up power line and a pull-down power line which are connected to a power line precharge portion arranged in a sub-hall area;
   a pull-down driver which is connected to a pull-down power line;
   a single normal driver prepared on one side of the pull-up power line; and
   a plurality of over drivers arranged at regular intervals and partially connected to the pull-up power line,
   wherein the over drivers are driven by an over driving signal, the normal driver is driven by a normal driving signal, and the pull-down driver is driven by a pull-down driving signal,
   wherein the normal driver and the pull-down driver are arranged in the sub-hall area, and the over drivers and the unit bit line sense amplifiers are arranged on a bit line sense amplifier array.

2. The semiconductor memory device as recited in claim 1, wherein the number of over drivers corresponds to that of the unit bit line sense amplifiers.

3. The semiconductor memory device as recited in claim 1, wherein each of the plurality of over drivers is one of an NMOS transistor and a PMOS transistor.

4. The semiconductor memory device as recited in claim 2, wherein the normal driver is one of an NMOS transistor and a PMOS transistor.

5. The semiconductor memory device as recited in claim 3, wherein if each of the plurality of over drivers is the NMOS transistor, a driving voltage is a boost voltage.

6. The semiconductor memory device as recited in claim 4, wherein if the normal driver is the NMOS transistor, a driving voltage is a boost voltage.

* * * * *